(12) United States Patent
Hickling

(10) Patent No.: US 7,439,728 B1
(45) Date of Patent: Oct. 21, 2008

(54) SYSTEM AND METHOD FOR TEST SOCKET CALIBRATION USING COMPOSITE WAVEFORM

(75) Inventor: Robert L. Hickling, Princeville, HI (US)

(73) Assignee: Credence Systems Corporation, Milpitas, CA (US)

( * ) Notice: Subject to any disclaimer, the term of this patent is extended or adjusted under 35 U.S.C. 154(b) by 236 days.

(21) Appl. No.: 11/185,569

(22) Filed: Jul. 19, 2005

Related U.S. Application Data

(62) Division of application No. 10/729,800, filed on Dec. 4, 2003, now Pat. No. 7,009,382.

(51) Int. Cl.
*G01R 31/00* (2006.01)
(52) U.S. Cl. .................................... 324/158.1
(58) Field of Classification Search ................ 324/73.1, 324/158.1, 763–765, 601; 702/91; 714/724
See application file for complete search history.

(56) References Cited

U.S. PATENT DOCUMENTS

| | | | |
|---|---|---|---|
| 5,703,489 A * | 12/1997 | Kuroe | 324/601 |
| 5,867,030 A | 2/1999 | Sato | |
| 6,492,797 B1 * | 12/2002 | Maassen et al. | 324/74 |
| 6,794,861 B2 * | 9/2004 | Maassen et al. | 324/158.1 |
| 6,804,620 B1 * | 10/2004 | Larson et al. | 702/91 |
| 6,979,996 B2 * | 12/2005 | Fleishman | 324/158.1 |
| 2003/0016041 A1 | 1/2003 | Ueda et al. | |

\* cited by examiner

*Primary Examiner*—Vinh P Nguyen

(57) ABSTRACT

A system and method for calibration of a test socket using a composite waveform. A group of input signal pins of test system are coupled together. A pin belonging to the group is selected as a pin under calibration. A first calibration edge is applied to the pin under calibration. After a delay, a group of complementary edges is applied to the remaining pins of the group. As a result of the coupling of the pins, a response comprising a reflected edge and a transmitted combined edge are produced, which overlap to form a composite waveform. A comparator is used to detect an observable feature in the composite waveform to obtain timing information with respect to the pin under calibration and the remaining pins of the group. Each pin may be analyzed in turn, and the group of pins calibrated using the acquired information.

7 Claims, 11 Drawing Sheets

SYSTEM AND METHOD FOR TEST SOCKET CALIBRATION USING COMPOSITE WAVEFORM

This is a divisional patent application of application Ser. No. 10/729,800, filed on Dec. 4, 2003, now U.S. Pat. No. 7,009,382, which is hereby incorporated by reference to this specification.

FIELD OF THE INVENTION

The present invention relates to Automatic Test Equipment (ATE) used to test packaged electronic circuits. More specifically, the invention is directed calibration of test systems and their interfaces to devices under test.

BACKGROUND ART

Advances in semiconductor design and fabrication have resulted in integrated circuits (ICs) with a wide range of functions and a large number of inputs and outputs. Complex packages having hundreds of pins may be required for housing such integrated circuits. Hybrid circuits may also require packages with large pin counts.

In ATE systems, the device(s) being tested are typically mounted in a test socket that provides a signal path to the pins of the device under test (DUT). For purposes of this disclosure, a socket is intended to include fixtures used to provide an interface to devices that may not have physical "pins," (e.g., surface mount devices or individual die).

An individual integrated circuit or hybrid circuit typically has a number of points of physical contact for signal input that mate to a test socket. This collection of points will be referred to as an "interface plane." The physical points of the interface plane may be distributed in a three-dimensional space, and are not restricted to a geometric plane. The interface plane serves as a reference for the timing relationships for signals associated with the points (pins).

FIG. 1 shows a block diagram for a typical ATE test system 100. A DUT 105 with an array of pins 110 has a number of input pins coupled to test signal lines 115. Each of the signal lines 115 is coupled to a driver 125 belonging to an array of drivers 120. The array of drivers 120 is coupled to a controller 130 then determines the nature of the signals applied by the drivers, and also the timing relationships between the signals.

In a test system, the signal lines 115 may have different lengths and may also have different impedance characteristics. The differences between the signal paths may result in the timing relationships between signals being altered at the interface plane of the device under test (DUT) 105, in comparison to the timing relationships at the output of the array of drivers 120. It is thus desirable to measure the differences in the signal timing and apply corrections to the signal sources by calibrating the complete test setup.

Time domain reflectometry (TDR) is a common method for determining the timing relationships between pins of a circuit. In conventional TDR, the pins of the DUT 105 are all opened or shorted to ground and a test edge may be applied to each pin in turn. The impedance discontinuity of an open circuit will produce a positive reflection, whereas a short circuit will produce a negative reflection. The time required for the return of the reflected input edge at each pin provides information that may be used to adjust the timing of the input signals for the pins so that they arrive at the interface plane with the desired phase relationships.

Conventional TDR systems and techniques are limited in accuracy by the rise time of the test edge. Since the timing of a reflected edge is determined through the detection of the edge, there is an inherent ambiguity in measurement of an edge having a finite rise time.

Another difficulty with current systems is that in addition to the differences in signal delay between different drivers and the interface plane, there are also typically differences in the length of path traveled by the signals used in TDR calibration. Signal paths are also commonly analyzed in a piecewise fashion that produces a cumulative error that increases with the number of test segments.

SUMMARY OF INVENTION

Accordingly, embodiments of the present invention provide a system and method for comprehensive calibration of test systems. Embodiments of the present invention provide a system and method for calibration that has a decreased dependence on the rise time of an edge, and not degraded by piecewise testing of the signal path. Embodiments of the present invention also provide for self-correction of the calibration system.

In a method embodiment of the present invention, a group of input signal lines of a test system are coupled together. A pin belonging to the group is selected as a pin under calibration. A first calibration edge is applied to the pin under calibration. After a delay, a group of complementary edges is simultaneously applied to the remaining pins of the group. As a result of the coupling of the pins, a response comprising a reflected edge and a transmitted edge are produced, which combine to form a composite waveform. An observable feature in the composite waveform is used to obtain timing information with respect to the pin under calibration and the remaining pins of the group.

In another embodiment, an automated test equipment (ATE) calibration system is disclosed. A set of pin drivers having adjustable phase relationships are coupled to a controller, and are also coupled to a test socket by a plurality of signal lines. The test socket comprises a common coupling that is coupled to the plurality of signal lines. A comparator for detecting an edge is coupled to each of the signal lines, and also coupled to the controller.

These and other objects and advantages of the present invention will no doubt become obvious to those of ordinary skill in the art after having read the following detailed description of the preferred embodiments which are illustrated in the various drawing figures.

DESCRIPTION OF THE PREFERRED EMBODIMENTS

In the following detailed description of the present invention, a system and method for test socket calibration, numerous specific details are set forth in order to provide a thorough understanding of the present invention. However, it will be obvious to one skilled in the art that the present invention may be practiced without these specific details. In other instances well known methods involving well-known circuits, components, interconnects, interfaces, etc., have not been described in detail so as not to unnecessarily obscure aspects of the present invention.

Figure 1:
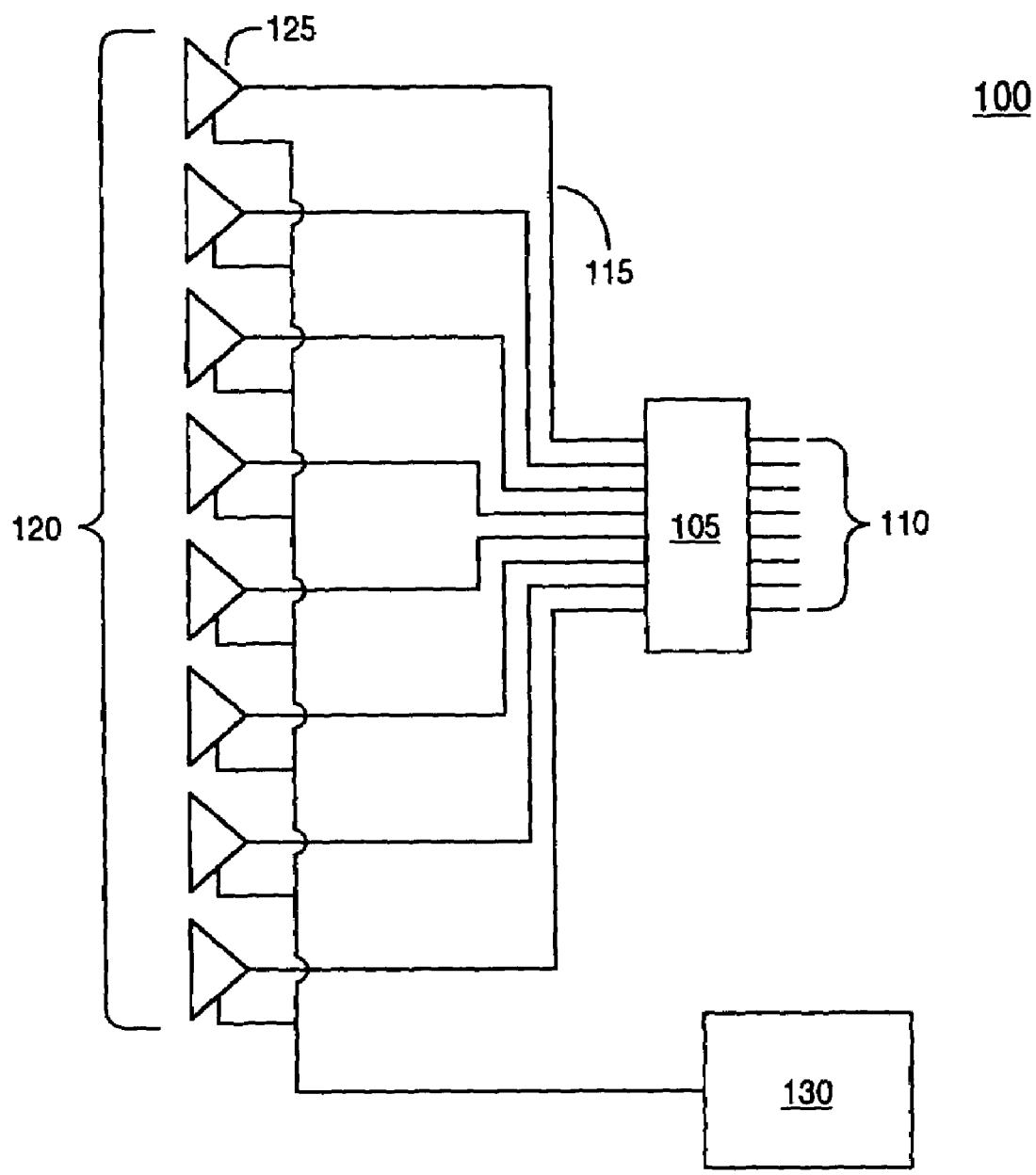
FIG. 1 shows a block diagram for a typical ATE test system.
Figure 2A:
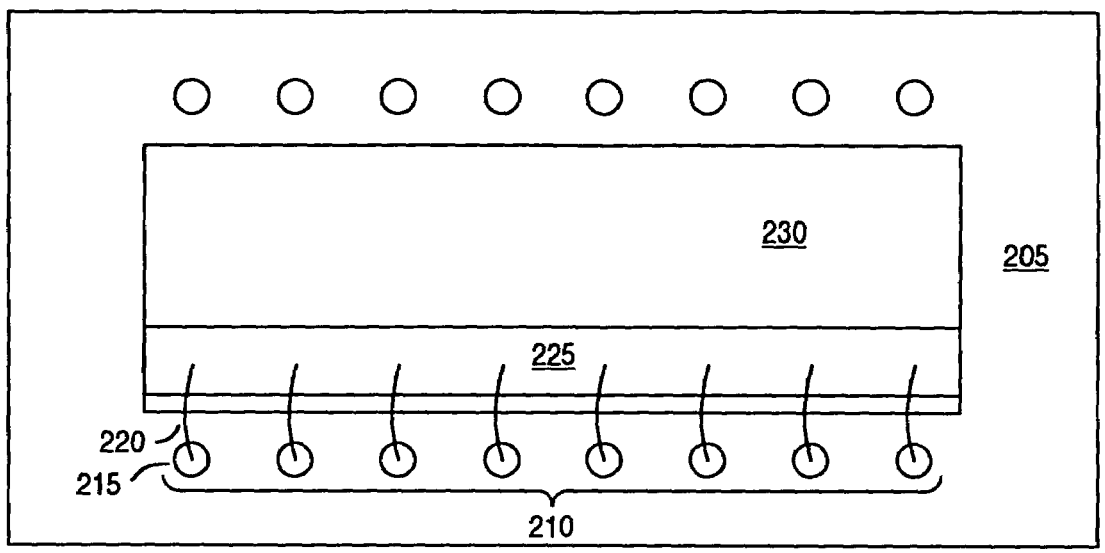
FIG. 2A shows a schematic diagram for a test package with input coupling in accordance with an embodiment of the present claimed invention.

FIG. 2A shows a schematic diagram for a line input coupler 200 in accordance with an embodiment of the present invention. A circuit package 205 comprises an array of input pins 210. Each of the input pins 210 is coupled to a conductor 225 on a substrate 230 by a bond wire 220. The conductor 220 couples the input pins together by providing what is essentially a short circuit connection between pins.

The substrate 230 isolates the conductor 220 from the package 201. For metal packages, the body of the package 201 is typically held at ground potential. In the case of a dielectric package (e.g., ceramic or polymer packages), the substrate 230 may be omitted. The substrate 230 may also be a semiconductor material such as silicon.

In the example of FIG. 2A, the connection between the pin 210 and the conductor 220 is identical for each pin 210. Thus the internal connections to the conductor do not introduce any differences in signal delay between the pins. The input line coupler 200 is thus able to be coupled to the test input lines of an ATE system and not alter the externally observable differences in delay that are due to the differences in the signal lines.

Although a pin and wirebond connection is shown in FIG. 2A, the short circuit condition between pins or contacts may be established in different ways in different package types. For example, printed metal traces may be used in ball grid array (BGA) packages or leadless chip carriers (LCC) that use flip-chip bonding of circuit substrates.

Figure 2B:
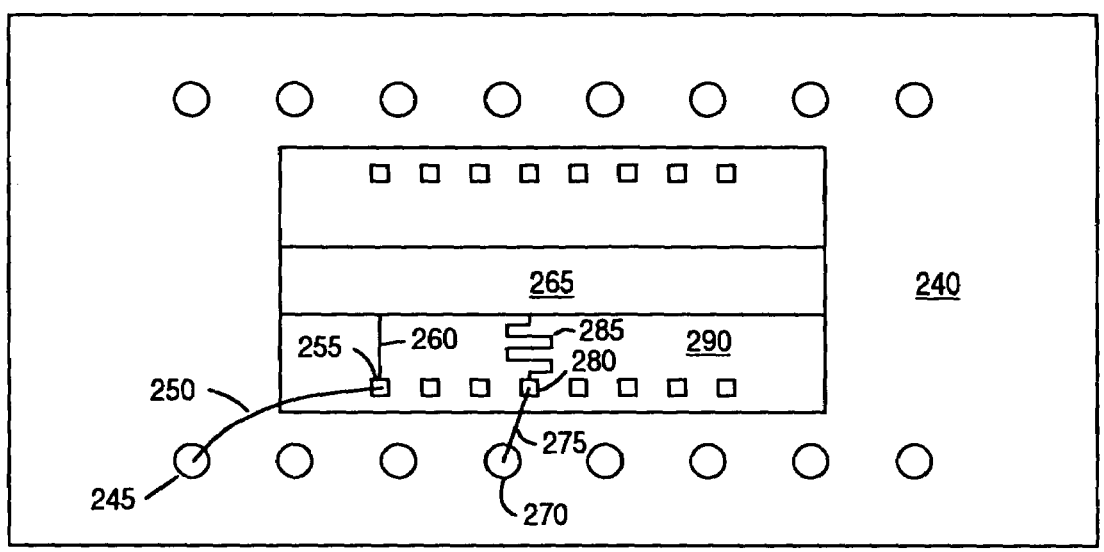
FIG. 2B shows a block diagram for a test package with compensated input coupling in accordance with an embodiment of the present claimed invention.

FIG. 2B shows a block diagram 235 for a test package with compensated input coupling in accordance with an embodiment of the present invention. A package 240 houses a substrate 290 that supports a conductor 265. The package 240 is similar to the package 230 of FIG. 2A; however, the circuit substrate 290 is smaller than the substrate 230, resulting in unequal wirebond lengths. Pin 240 is coupled to a pad 255 may a wire 250, and the pad 255 is coupled to the conductor 265 by a trace 260. Similarly, a pin 270 is coupled to a pad 280 by a wire 275, and the pad 280 is coupled to the conductor 265 by a trace 285.

Bond wire 275 is shorter than bond wire 250 resulting in a delay difference between the pads 255 and 280. In order to compensate for this delay difference, the trace 285 is made longer than the trace 260, so that there is no delay difference introduced between the pins 245 and 270, and the conductor 265.

In addition to zeroing out delay differences within a package, different trace lengths may be used to introduce intentional delay differences that may be required by the circuit being tested.

Figure 3:
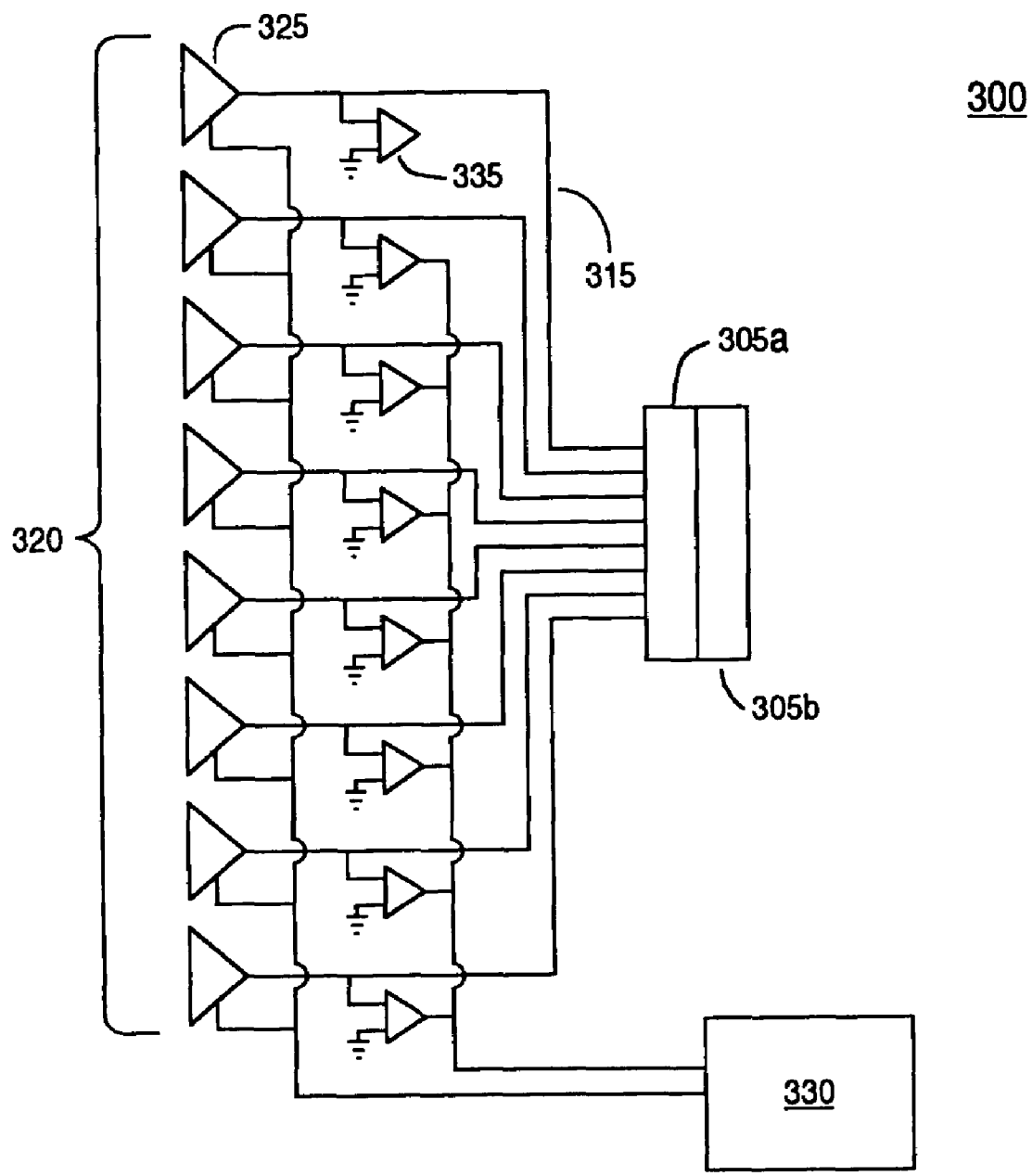
FIG. 3 shows a block diagram for an ATE system in accordance with an embodiment of the present claimed invention.

FIG. 3 shows a block diagram 300 for an ATE system in accordance with an embodiment of the present invention. An input line coupler 305b is coupled to a socket 305a, which is in turn coupled to a group of input signal lines 315. Each signal line 315 is also coupled to a driver/signal source 325 and a comparator 335. Each of the comparators and the drivers are also coupled to a controller 330.

The controller 330 provides for the control and timing of calibration signals from the drivers 325, and also manages the comparator measurements. In a specific embodiment described herein, the controller 330 controls the timing between edges that are output by the drivers 325. The controller 330 uses the comparators 335 to detect and analyze reflected and transmitted edges.

Figure 4A:
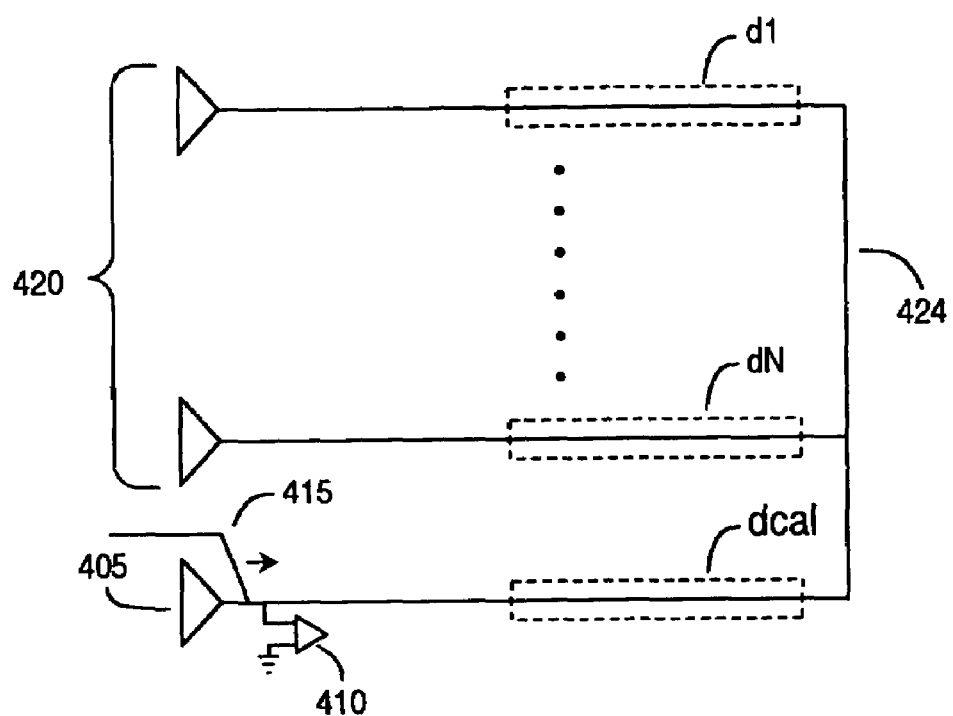
FIG. 4A shows a schematic diagram for an ATE system with an input edge applied to a line under calibration in accordance with an embodiment of the present claimed invention.

FIG. 4A shows a schematic diagram for an ATE system with an input calibration edge 415 applied by a driver 405 to an input signal line having a delay dcal. The remaining N complementary input lines 420 of the test system are characterized by delays d1 through dN. The N+1 lines shown constitute a group that are coupled by an input line coupler 424. Each line may be selected in turn and designated as the dcal line, with the remaining lines forming the set 420 of complementary lines.

The input coupler 424 provides for transmission and reflection of timing measurement edges in the system. Depending upon the degree of the delay difference between the signal lines, conventional time domain reflectometry may be performed to align the N+1 drivers as a first step in calibration, to roughly align the drivers.

The number of complementary lines N should be sufficient to produce a low enough impedance to provide a usable reflection on the line under calibration. In one embodiment N is greater than or equal to 50. It is also desirable that the average delay of the N lines after initial alignment have a small variation as each of the N+1 pins is selected as the calibration pin. In one embodiment, the variation in average delay is less than one percent over the N+1 pins.

Using conventional TDR, the delays may be measured for each of the lines and the driver timing adjusted so that a set of edges applied by the group of drivers will arrive at the input line coupler at roughly the same time. If conventional TDR is used, the lines will be tied to ground or opened, and the input coupler would not be present.

The selected line under calibration 405 is the only line being driven at the time the edge 415 is applied. Edge 415 is applied at a time that precedes a reference trigger time value by a pretrigger offset value. After initial alignment, the maximum time delay difference between the N+1 input signal lines will be less than the rise time ($t_r$) for the calibration edge 415, and is preferably less than about one third of the rise time.

Figure 4B:
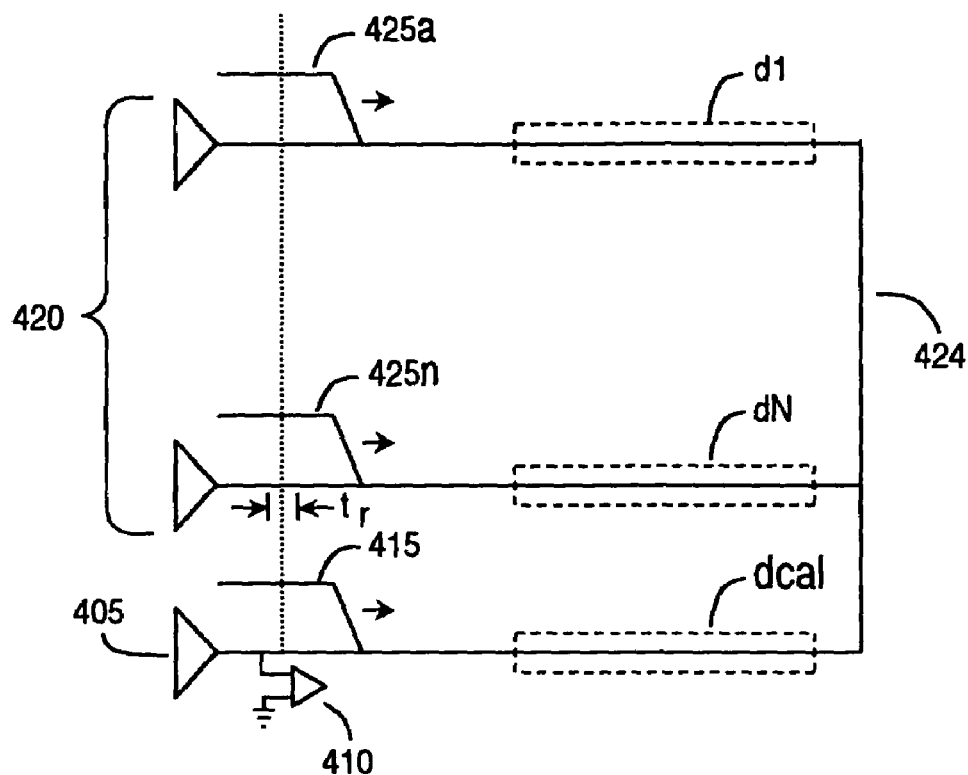
FIG. 4B shows a schematic diagram for the ATE system of FIG. 4A with an input edge applied to a complementary set of lines in accordance with an embodiment of the present claimed invention.

FIG. 4B shows a schematic diagram for the ATE system of FIG. 4A with an input edge applied to each of the complementary set of lines 420. The set of edges 425a through 425n on the lines 420 is triggered with respect to a reference trigger time value. Each of the individual edges may have a relative offset time value with respect to reference trigger time, due to the initial alignment of the drivers.

The pretrigger value is typically less than the rise time of the calibration edge, and preferably equal to about one third to one half of the rise time. The initial alignment of complementary edges 425a through 425n may vary about the reference trigger time value. In one embodiment the reference trigger time value is the average of the relative offset time values for the N lines.

Under the initial timing conditions that have been established for the set of N+1 signal lines, the edge 415 will reach the input coupler 424 at about the same time, or earlier, than the edges 425a-425n applied to the complementary lines 420.

Figure 4C:
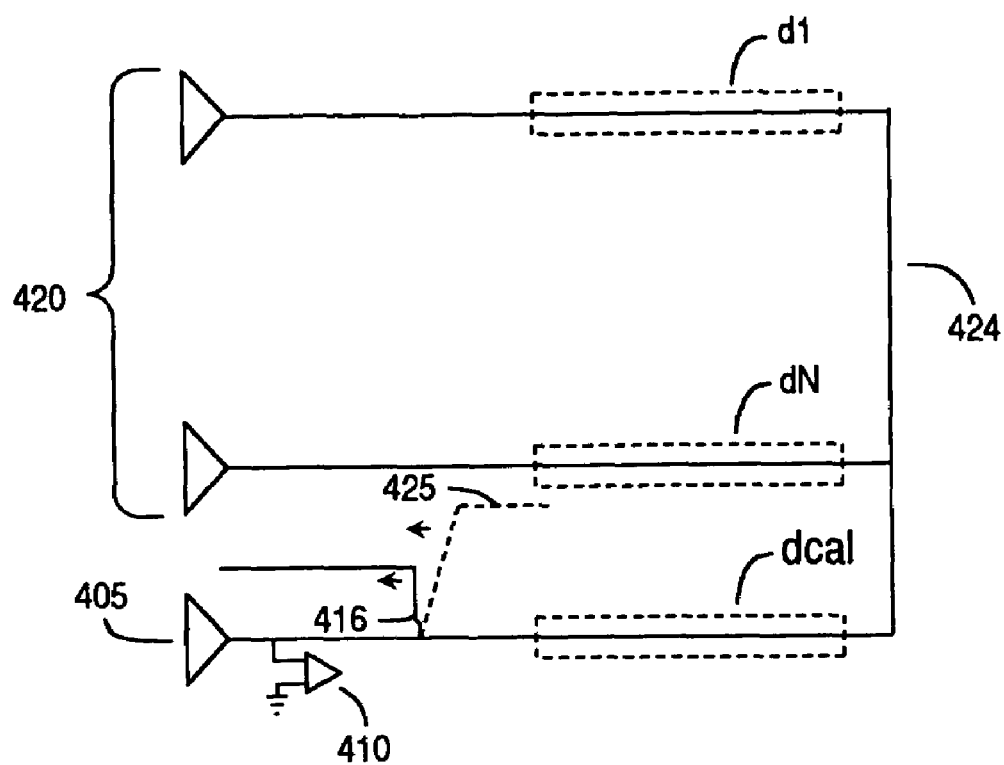
FIG. 4C shows a schematic diagram for the ATE system of FIG. 4B with a reflected edge and a composite waveform in accordance with an embodiment of the present claimed invention.

FIG. 4C shows a schematic diagram for the ATE system of FIG. 4B after the passage of a short period of time. The complementary lines 420 in parallel present a low impedance discontinuity to the applied edge 415 at the line coupler 424. The low impedance discontinuity produces a negative edge reflection 416 that is observable on the line under calibration by the comparator 410.

The edge reflection 416 of FIG. 4B is shown propagating towards the comparator 410, and is followed by a transmitted combined edge 425. The edge reflection 416 is the reflection of the calibration edge 415 at the input line coupler 424, and the combined edge 425 is the superposition of the complementary edges 425a through 425n that were transmitted through the input line coupler 424 to the line under calibration.

Figure 4D:
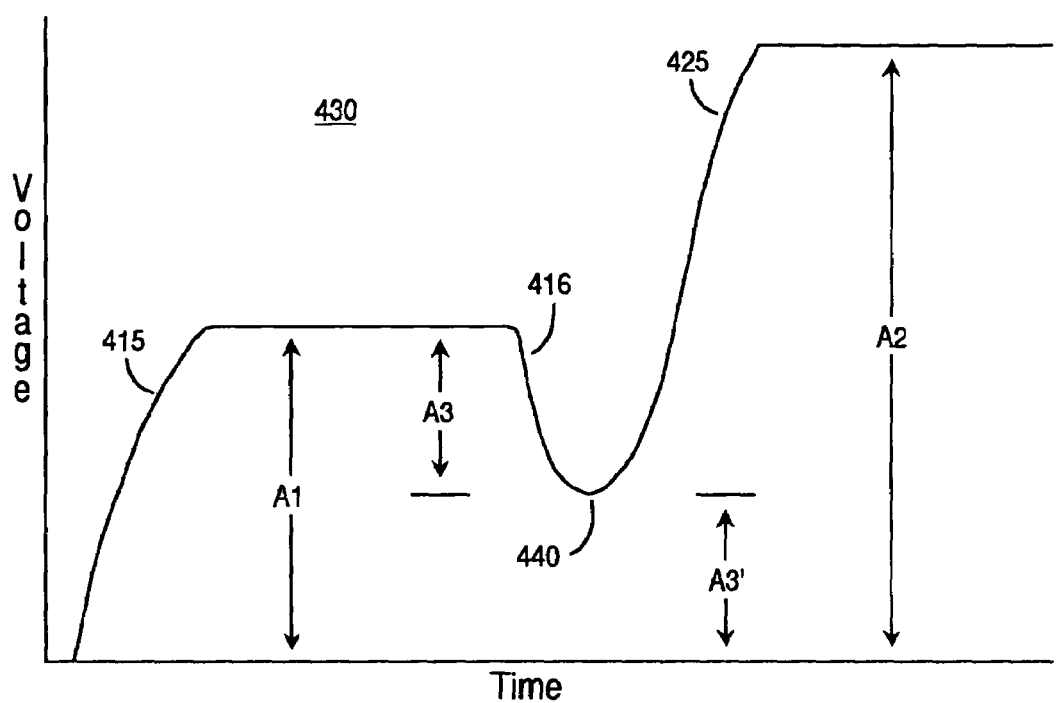
FIG. 4D shows a schematic diagram of the composite waveform produced by the superposition of a reflected edge and combined edge of FIG. 4C in accordance with an embodiment of the present claimed invention.

FIG. 4D shows a schematic diagram of a composite waveform 430 observed by the comparator 410. The composite waveform is essentially a combination of the calibration edge 415, the reflected edge 416, and the combined edge 425. The overlap between edge reflection 416 and combined edge 425 produces a trough feature 440 in the composite waveform 430.

The leading portion of the waveform 430 has an amplitude A1 that is essentially the amplitude of calibration edge 415, whereas the trailing portion of composite waveform 430 has an amplitude A2 that is essentially the amplitude of the combined edge 425. Amplitude A2 will typically be different from Amplitude A1. In a matched impedance system the value of A2 is about twice the value of A1. This difference in amplitude facilitates identification of the combined edge 425.

The trough feature 440 has an amplitude A3 that is a function of the degree of overlap (delay) between edge reflection 416 and combined edge 425. The comparator 410 of FIG. 4C may be used to detect the passage of the trough feature when its amplitude A3 is at a particular value (e.g., a percentage of A1), and thus establish a relative timing offset between the line under calibration 405 and the complementary lines 420.

For example, if edge reflection 416 and combined edge 425 have sufficient overlap so that a trough feature cannot be detected, the reference offset value may be incrementally increased, thereby separating the two edges. As edge reflection 416 and combined edge 425 are separated, a trough 440 will appear, and the trough amplitude A3 will increase with further incremental increases in the relative offset value.

Conversely, if edge reflection 416 and combined edge 425 do not overlap at the initial setting of the reference offset value, the reference offset value may be incrementally decreased until overlap and trough formation occur. Initial misalignment does not prevent calibration and can be overcome by iteration of the process.

Ultimately, through increasing and/or decreasing of the pretrigger value, a particular relative offset time value for A3 may be achieved (e.g., for one half of A1). The comparator 410 may be capable of detecting multiple edges or levels, and thus may be used by the controller 330 to ascertain the initial degree of edge overlap and subsequently adjust the reference offset to produce a desired level for A3.

The use of A3 as a reference feature has the particular advantage of increasing sensitivity with decreasing rise time. As the overlapping slopes of edge reflection 416 and combined edge 425 become steeper, a greater change is observed in A3 for a given change in separation between the edges. As test systems evolve and faster rise times are used, measurement sensitivity will increase. Although the amplitude A3 of the trough 440 is the preferred reference for determining the relative position between edge reflection 416 and combined edge 425, other features of the composite waveform 430 may be used (e.g., A3').

Each of the N+1 lines may be selected as a line under calibration, and a relative timing offset value obtained by creation and analysis of the composite waveform 430. The reference trigger time value provides a global time reference for the N+1 drivers, and a relative timing offset is established for each line. Thus, the determination of a relative timing offset for each individual line with respect to a reference trigger time produces an alignment configuration for set of drivers as a whole.

Figure 5:
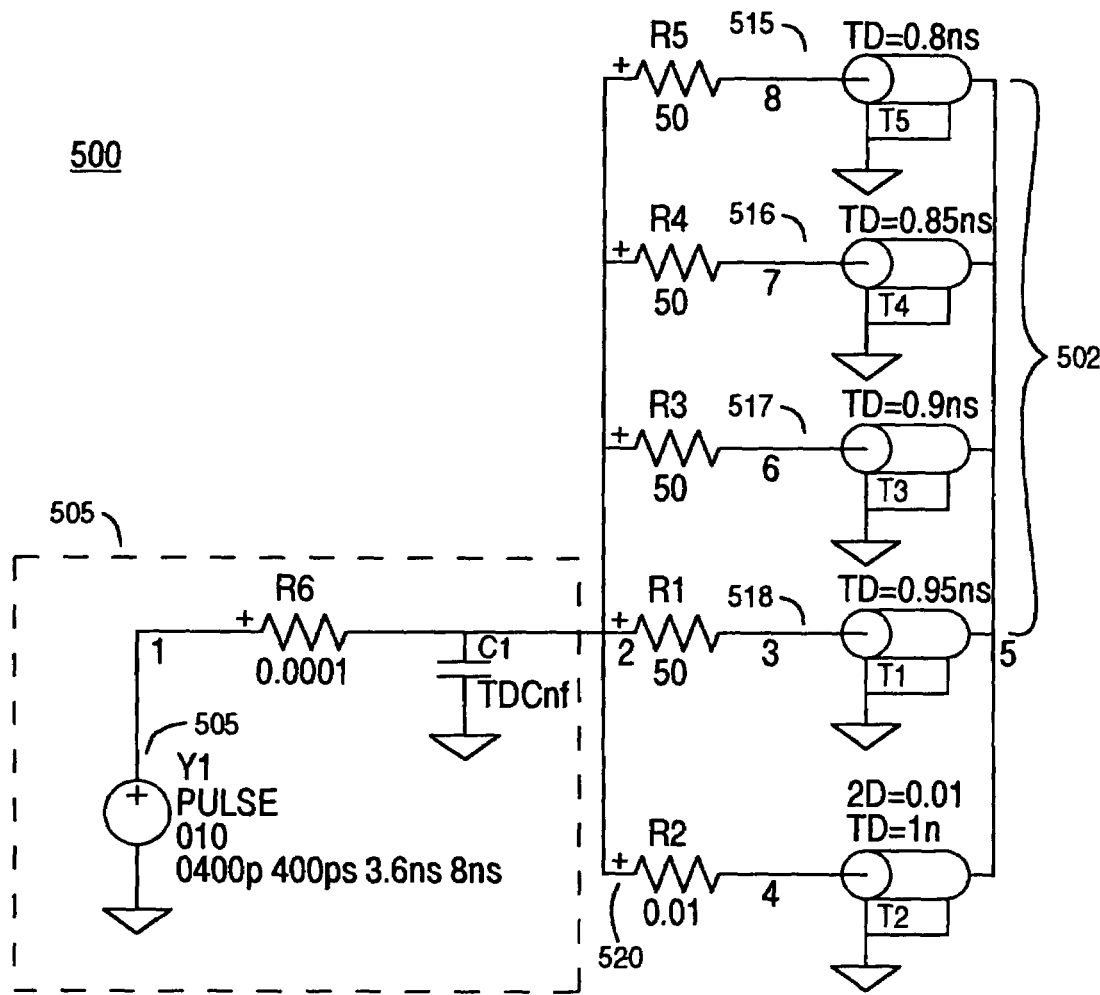
FIG. 5 shows a representation of a test system under calibration in accordance with an embodiment of the present claimed invention.

FIG. 5 shows a representation 500 of a test system under calibration in accordance with an embodiment of the invention. Representation 500 shows examples of system values associated with the production of a composite waveform during calibration of a set of pins.

An edge source 505 comprising a pulse generator 510 is used to generate a pulse with an amplitude of one volt, rise and fall times of 400 ps, pulse width of 3.6 ns, and a pulse period of 8 ns. The pulse width is much larger than the delays associated with the lines being calibrated.

A set of lines 502 to be calibrated is shown. Each of lines 515, 516, 517, and 518 have a characteristic impedance of 50 ohms and represent lines that may be individually selected for calibration. Line 520 represents a set of complementary lines and has a characteristic impedance of 0.01 ohms. Lines 515, 516, 517, and 518 have delays of 0.8 ns, 0.85 ns, 0.9 ns, and 0.95 ns, respectively. Line 520 has a delay of 1.00 ns. Node 5 represents an input coupler that ties all of the lines together. The set of calibration lines 502 represent pretrigger values of 0.05 ns, 0.10 ns, 0.15 ns and 0.20 ns.

Figure 6:
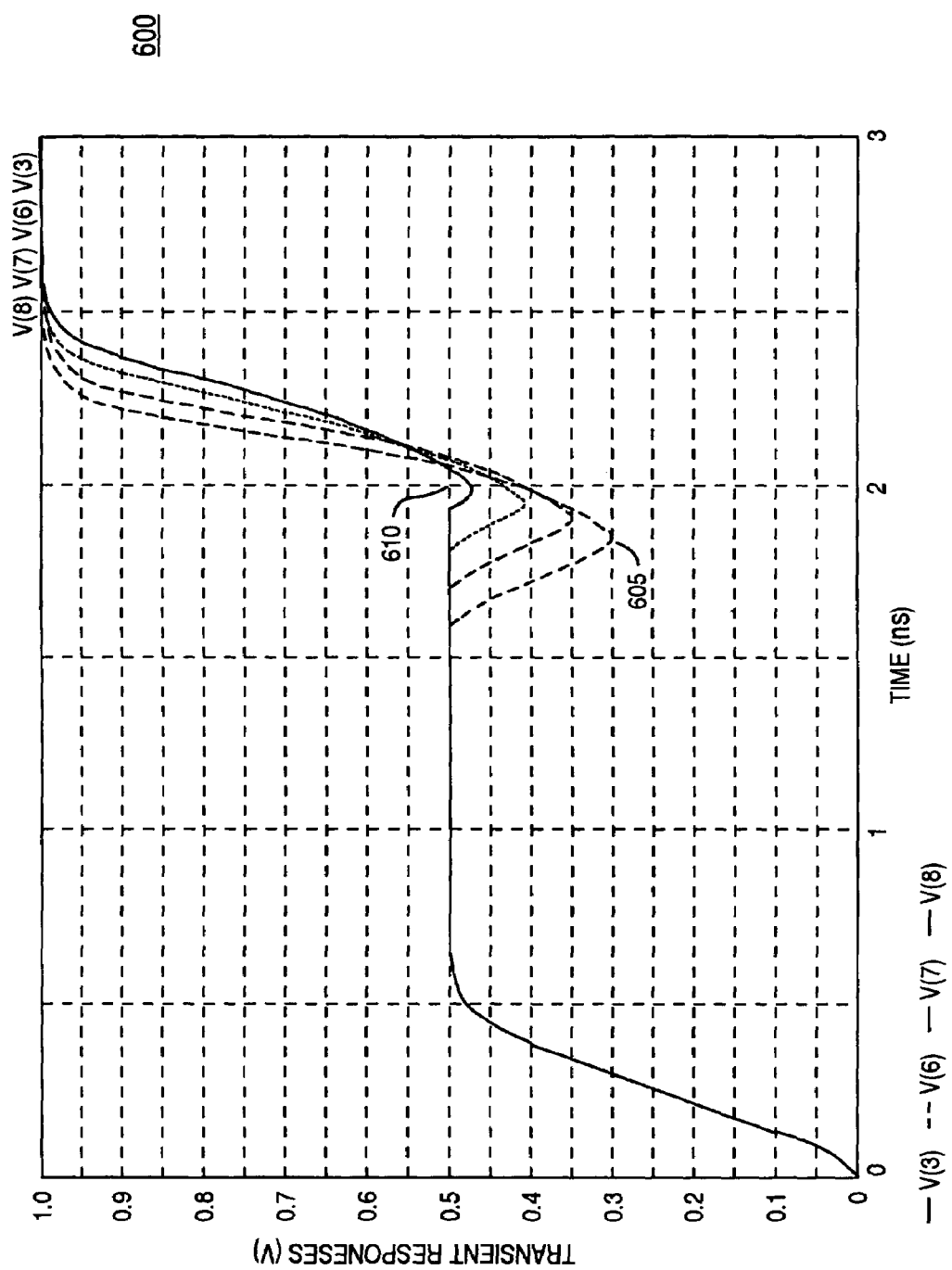
FIG. 6 illustrates a response plot of the circuit of FIG. 5 in accordance with an embodiment of the present claimed invention.

FIG. 6 illustrates a response plot of the circuit representation of FIG. 5 in accordance with an embodiment of the invention. Plots V(8), V(7), V(6), and v(3) represent the composite waveform observed at nodes 8, 7, 6, and 3, respectively. Line 515 has the greatest delay difference with respect to the complementary lines 520, and thus produces a composite waveform with a trough 605 that has the greatest depth. Conversely, Line 518 has the smallest delay difference with respect to the complementary lines 520 and thus has the shallowest trough 610.

Figure 7:
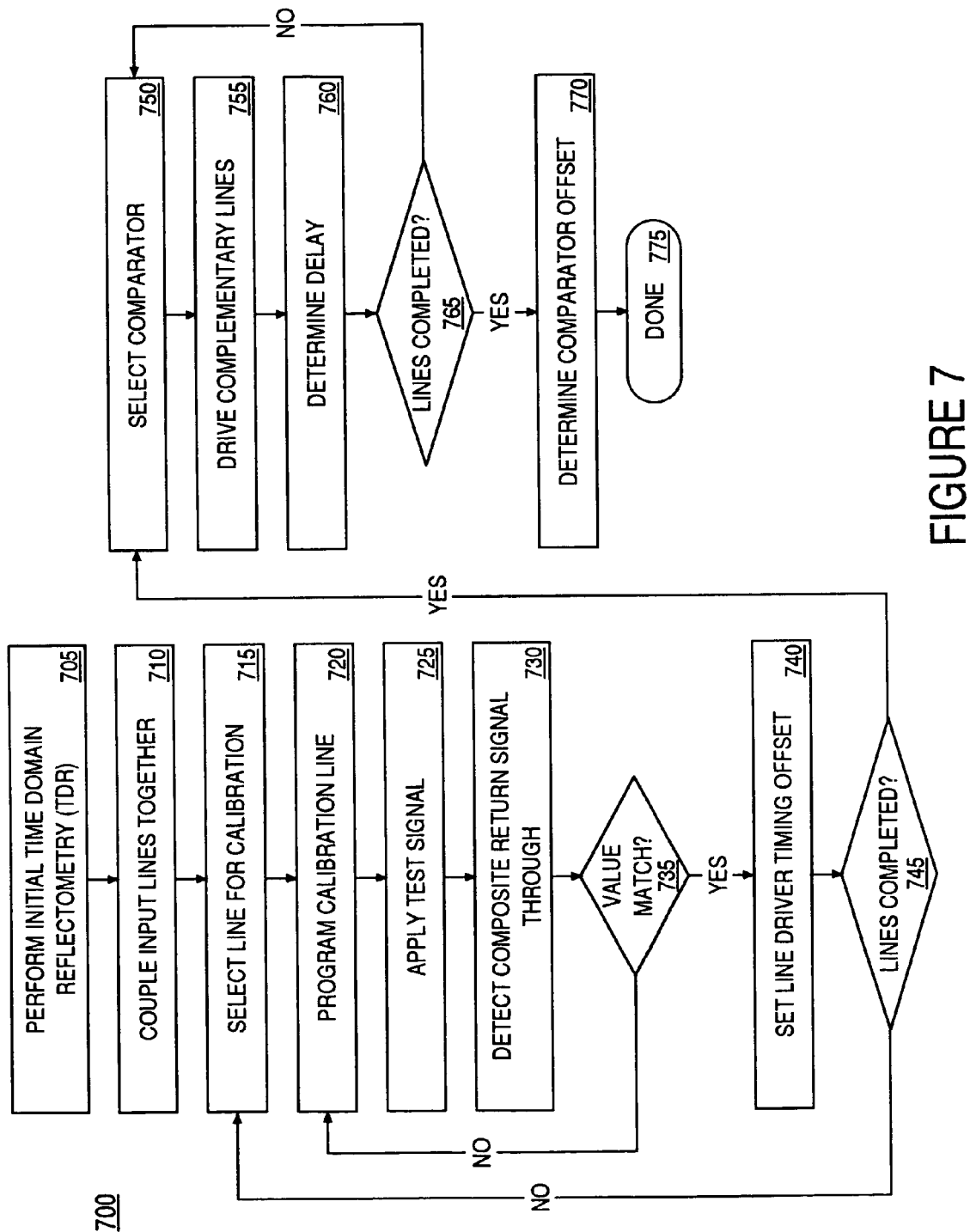
FIG. 7 shows a flow chart for calibration of an ATE system in accordance with an embodiment of the present claimed invention.

FIG. 7 shows a flowchart 700 for calibration of a set of input signal lines in an ATE system in accordance with an embodiment of the present invention. In step 705, conventional TDR is performed to provide an initial alignment for the drivers associated with the signal lines. This step is optional and may be omitted. Generally, it is desirable that the delay difference of the initial alignment be less than about one third of the calibration edge used in the system.

In step 710, the input signal lines are coupled to each other. In contrast to conventional TDR, the input signal lines are not opened or coupled to ground. This coupling provides the physical configuration that is used to create the composite waveform that is used for calibration.

In step 715, a signal line is selected for calibration. The line under calibration will have an edge applied to it in advance of the edges applied to the remaining signal lines.

In step 720 a relative timing offset value is selected for the driver of the line under calibration. The initial value for the relative timing offset value is a pretrigger time value that is preferably one third to one half of the rise time of the calibration edge. Subsequent values may be obtained by incrementing or decrementing the initial value.

In step 725, a test signal is applied. The test signal includes a calibration edge applied to the line under calibration and a set of complementary edges applied to the remaining signal lines at a reference trigger time value.

In step 730, a reflected edge and the composite propagating towards the driver of the line under calibration are examined for a composite waveform trough (or other feature). The composite waveform is a superposition of a reflection of the calibration edge and the transmitted complementary edges. The composite waveform examination may be performed by a comparator managed by a controller.

In step 735, a check is made to see if a composite waveform trough exists, and whether its amplitude matches a predetermined value. If the observed trough amplitude does not match the predetermined value, then step 720 is executed. If there is a match, step 740 is executed.

In step 740, the current value for the relative timing offset is recorded or fixed for the driver of the line under calibration.

In step 745, a check is made to see if a relative timing offset value has been determined for each line in the set of input signal lines. If each line has not been calibrated, step 715 is executed. If each signal line has been calibrated, optional steps 750 to 770 may be performed.

Optional steps 750 to 770 may be used to deskew the comparators coupled to the input signal lines. If the there is a significant difference among signal lines in the delay between the comparator and the signal source (driver), an unacceptable error may result. Deskewing accounts for the comparator/driver variation.

In step 750 a comparator/signal line is selected. In step 755, the drivers on the other non-selected (complementary) lines are triggered to produce a combined edge. In step 760, the time required for the comparator to detect the combined edge is measured. In step 765, a check is made to see if each comparator/line has been selected. If not all line delays have been measured, step 750 is executed. If all line delays have been measured, step 770 is executed. In step 770, the set of measurements may be used to adjust the timing of each of the drivers to offset the observed skew in the comparators. At step 775, calibration is complete.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for determining a relative timing offset value for a test signal line belonging to a group of test signal lines in a test system comprising:
    coupling the lines belonging to said group to all other lines in said group;
    selecting a line from said group as a line under calibration;
    applying a calibration edge to the line under calibration, wherein said calibration edge is applied at a time preceding a reference trigger time value by a pretrigger offset time value;
    applying a group of complementary edges to the non-selected lines at a reference trigger time value; and
    observing a waveform feature of a composite waveform, wherein said composite waveform is a superposition of said complementary edges and a reflection of said calibration edge.

2. The method of claim 1, further comprising adjusting said pretrigger offset time value, and repeating said applying of a calibration edge, said applying of a group of complementary edges, and said observing of a waveform feature of a composite waveform until a match is detected between a value for said waveform feature and a reference value.

3. The method of claim 2, further comprising recording the relative timing offset value associated with the detection of said match.

4. The method of claim 2, wherein said waveform feature is a trough in said composite waveform.

5. The method of claim 4, wherein said reference value is approximately one half of an amplitude of said calibration edge.

6. The method of claim 1, wherein said relative timing offset value is less than a rise time of said calibration edge.

7. The method of claim 6 wherein said relative timing offset value is approximately equal to one third to one half of said rise time.

* * * * *